(12) United States Patent
Espinosa et al.

(10) Patent No.: US 8,484,509 B2
(45) Date of Patent: Jul. 9, 2013

(54) RADIATION-HARDENED PROCESSING SYSTEM

(75) Inventors: Daniel C. Espinosa, North Bethesda, MD (US); Alessandro Geist, Bethesda, MD (US); David J. Petrick, Severna Park, MD (US); Thomas P. Flatley, Huntington, MD (US); Jeffrey C. Hosler, Annapolis, MD (US); Gary A. Crum, Silver Spring, MD (US); Manuel Buenfil, Olney, MD (US)

(73) Assignee: The United States of America as represented by the Administrator of the National Aeronautics Space Administration, Washington, DC (US)

( * ) Notice: Subject to any disclaimer, the term of this patent is extended or adjusted under 35 U.S.C. 154(b) by 313 days.

(21) Appl. No.: 12/854,546

(22) Filed: Aug. 11, 2010

(65) Prior Publication Data

US 2011/0107158 A1    May 5, 2011

Related U.S. Application Data

(63) Continuation-in-part of application No. 12/570,134, filed on Sep. 30, 2009.

(51) Int. Cl.
*G06F 11/00* (2006.01)

(52) U.S. Cl.
USPC .......................................................... 714/10

(58) Field of Classification Search
USPC .............................................................. 714/10
See application file for complete search history.

(56) References Cited

U.S. PATENT DOCUMENTS

| 6,073,251 | A  | * | 6/2000  | Jewett et al.     | 714/6.32 |
| 6,104,211 | A  | * | 8/2000  | Alfke             | 326/91   |
| 6,560,743 | B2 | * | 5/2003  | Plants            | 714/763  |
| 7,620,883 | B1 | * | 11/2009 | Carmichael et al. | 714/797  |
| 7,859,292 | B1 | * | 12/2010 | Shuler, Jr.       | 326/11   |

* cited by examiner

*Primary Examiner* — Michael Maskulinski

(57) ABSTRACT

A processing system including an FPGA having a dual port RAM and for use in hostile environments. The FPGA includes three portions: a C&DH portion; a first scratch pad portion receiving a first set of data, processing the first set of data, and outputting a first set of processed data to a first location of the RAM; and a second scratch pad portion receiving a second set of data identical to the first set of data, processing the second set of data in the same way that the first set of data is processed, and outputting a second set of processed data to a second location of the RAM. The C&DH portion compares the first set of processed data to the second set of processed data and, if the first set of processed data is the same as the second set of processed data, outputs one set of processed data.

10 Claims, 12 Drawing Sheets ated FPGA is compared to stored data from the second radiation-tolerant FPGA to detect errors in the data or the data processing.

RADIATION-HARDENED PROCESSING SYSTEM

INTRODUCTION

This patent application is a continuation-in-part of U.S. patent application Ser. No. 12/570,134, filed Sep. 30, 2009, titled "Radiation-hardened hybrid processor," the entire content of which is incorporated by reference herein.

ORIGIN OF THE INVENTION

The invention described herein was made by an employee of the United States Government, and may be manufactured and used by or for the Government for governmental purposes without the payment of any royalties thereon or therefor.

FIELD

The present teachings relate to a compact processing system at least for demonstrating the feasibility and performance of radiation hardening by software, error correction and corrective techniques that enable the use of commercial processing (non-radiation hardened) devices in hostile environments.

BACKGROUND

Modern electronic devices utilize processors to carry out various functions that are necessary to or that enhance the electronic device's functionality. Processors can be in the form of circuit boards, wired-in processors, or other fixed or removable elements containing components that carry out computations, data processing, and other functions.

Electronic devices can be designed to operate in hostile environments, meaning environments that can negatively affect the functioning of electronic devices. Hostile environments can include radiation or other conditions that are known to negatively affect the performance of electronic devices. It is thus useful to provide radiation hardening for processors and other elements of electronic devices that are used in hostile environments, to prevent and/or mitigate data errors and computational component failures due to radiation and other conditions.

Three levels of electrical device component radiation tolerance are presently available. The first level is an unprotected component, which can experience both recoverable errors (e.g., bit flips) and destructive errors when utilized in a hostile environment. The second level is commonly referred to as radiation tolerant, and includes electrical device components that are designed such that destructive errors are avoided in hostile environments, but recoverable errors such as bit flips may still occur. The third level is commonly referred to as radiation hardened, and includes electrical device components that experience neither recoverable nor destructive errors when utilized in a hostile environment.

Bit flip errors are a form of single-event upsets in which a state change occurs in memory or in a register, such as from 0 to 1 or vice versa. These are generally not fatal to the device, but can require correction to avoid propagation of errors in computations based thereon. Critical upsets are more serious errors, and generally require a shutdown and restart, or a reset of the computing device affected.

The processing power of radiation-hardened processors tends to be less than state-of-the-art commercially-available non-radiation-hardened processors. The processing power of a radiation-hardened processor can be, for example, one or two generations behind commercially-available non-radiation-hardened processors.

The use of commercial or non-space-rated devices in space applications and other hostile environments is desirable due to the growing performance needs (and size and weight limitations) for emerging space applications and the slow performance of existing space-qualified devices.

To ensure that radiation hardening of commercial components by design and software truly provides error-free data collection and processing, a platform is needed for testing the feasibility and performance of radiation hardening by design and software, error correction and corrective techniques enabling use of commercial processing (non-radiation hardened) devices in hostile environments.

SUMMARY

The present teachings provide a processing system including an FPGA having a dual port RAM and for use in hostile environments. The FPGA includes three portions: a C&DH portion; a first scratch pad portion receiving a first set of data, processing the first set of data, and outputting a first set of processed data to a first location of the RAM; and a second scratch pad portion receiving a second set of data identical to the first set of data, processing the second set of data in the same way that the first set of data is processed, and outputting a second set of processed data to a second location of the RAM. The C&DH portion compares the first set of processed data to the second set of processed data and, if the first set of processed data is the same as the second set of processed data, outputs one set of processed data.

The present teachings also provide a radiation hardening by design and software demonstration payload for interfacing with an external platform via a single port. The payload includes the following stacked slices: a first set of slices comprising a first power slice and a first processor slice; a second set of slices comprising a second power slice and a second processor slice, the second set of slices being configured to operate independently of the first set of slices; and a communication and power adapter slice configured to provide power from the external platform to the first power slice and the second power slice and to provide communication between the external platform and the first processor slice or between the external platform and the second processor slice.

The present teachings further provide a method for radiation hardening a processing system by design and software. The method includes, within a first radiation-tolerant FPGA of the processing system, processing a first set of data to create a first set of output data; processing a second set of data that is identical the first set of data to create a second set of output data; comparing the first set of output data to the second set of output data to detect errors in the data or the data processing; and storing one of the first set of output data and the second set of output data in a memory of the processing system if no errors are detected. The method also includes within a second radiation-tolerant FPGA of the processing system, processing a third set of data that is identical to the first and second sets of data to create a third set of output data; processing a fourth set of data that is identical the first, second, and third sets of data to create a fourth set of output data; comparing the third set of output data to the fourth set of output data to detect errors in the data or the data processing; and storing one of the third set of output data and the fourth set of output data in a memory of the processing system if no errors are detected. Stored data from the first radiation-tolerant FPGA is compared to stored data from the second radiation-tolerant FPGA to detect errors in the data or the data processing.

Additional objects and advantages of the present teachings will be set forth in part in the description which follows, and in part will be obvious from the description, or may be learned by practice of the teachings. The objects and advantages of the present teachings will be realized and attained by means of the elements and combinations particularly pointed out in the appended claims.

It is to be understood that both the foregoing general description and the following detailed description are exemplary and explanatory only and are not restrictive of the present teachings, as claimed.

The accompanying drawings, which are incorporated in and constitute a part of this specification, illustrate embodiments of the present teachings and, together with the description, serve to explain the principles of the present teachings.

BRIEF DESCRIPTION OF THE DRAWINGS

Exemplary embodiments of the present teachings are described below with reference to the appended drawings, in which.

DETAILED DESCRIPTION

In typical science missions conducted in hostile environments, it can be desirable to give up some reliability for increased processing power, because science instruments have high processing requirements and may not be as critical as, for example, safety systems. Thus, some science missions may find it beneficial to employ commercially-available processors that are not fully radiation hardened (but that are radiation tolerant) to realize increased processing power, even if some non-destructive errors such as bit flips may occur and need to be mitigated. The present teachings employ radiation hardening by design and software to increase the reliability of such commercially-available radiation-tolerant processors.

Various methods can be employed in accordance with the present teachings to detect and mitigate errors while limiting the computational overhead required for such detection and mitigation. Radiation hardening by design and software can ensure that data processing carried out by the processing system is lossless, in that erroneous processed data is not generated and that desired information in the original data can be retrieved after processing.

A processing system in accordance with the present teachings can be utilized with an external platform operating in a hostile environment for demonstrating an implementation of radiation hardening by design and software, error correction and corrective techniques that can enable the use of commercial processing (non-radiation hardened) devices in space.

Existing processing systems for use in space applications utilize a command and data handling (C&DH) system that provides control processing, data handling and storage, command decoding, and telemetry gathering. Health of the processing system is typically monitored by the CD&H system. In some existing processing systems for space applications, short periods of communication take place with a command center or other remote station so that the health of the processing system can be checked by the command center, including, for example, the processing system's temperature and the health of its processors (e.g., was there an upset and did the processor correct itself).

The present teachings contemplate providing a processing system that can be used as a demonstration platform to perform trials to evaluate the feasibility and performance of an implementation of radiation hardening by design and software, and that can interface with communication interfaces for external platforms that operate in hostile environments. An exemplary external platform is the Materials International Space Station Experiment-7 (MISSE-7), a test bed for materials and coatings attached to the outside of the International Space Station that will be evaluated for the effects of atomic oxygen, ultraviolet light, direct sunlight, radiation, and the extremes of heat and cold.

Figure 1:
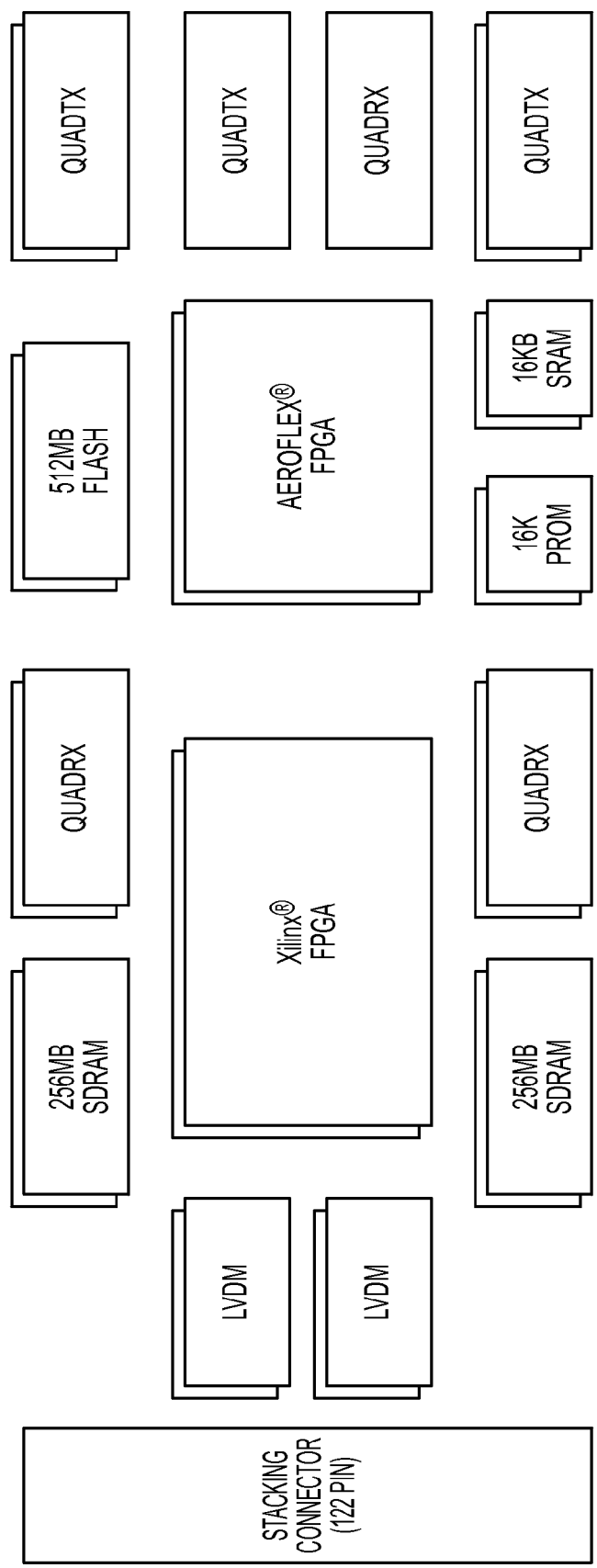
FIG. 1 is a schematic diagram of an embodiment of a processing system according to the present teachings.

FIG. 1 is a schematic diagram illustrating an embodiment of a processing system in accordance with the present teachings. The illustrated processor card includes two field programmable gate arrays that can be reprogrammed after installation on the processing card, such as Xilinx® Virtex-4 FX60 FPGAs. The Xilinx® Virtex-4 FX60 FPGAs are not space rated: they are radiation-tolerant but not radiation-hardened. Each Xilinx® Virtex-4 FX60 FPGA can include two IBM® PowerPC® processors and can additionally include a 32-bit "soft" RISC processor (see FIG. 5). The Xilinx® Virtex-4 FX60 FPGAs are preferably mounted in a back-to-back configuration, so that all or substantially all of the connectors are shared to minimize the space and volume of the installation and obtain computational efficiencies. In accordance with various embodiments of the present teachings, by properly grouping common inputs and outputs to and from components having a back-to-back configuration, it is possible to execute the same instructions or code on both of the components sharing the back-to-back configuration. This is useful in the context of radiation hardening by software, where the same code, instructions or application is run on two identical components (i.e., the two Xilinx® FPGAs) and the resulting data corruption indicia are compared to identify errors and repeat the computations. A back-to-back integrated circuit card configuration permits very high component densities and can result in the smallest amount of physical space required for the components comprising the integrated circuit card.

One skilled in the art will understand that the Xilinx® FPGAs and other processing system components need not be mounted in a completely back-to-back configuration and need not share all connectors. Indeed, sharing signals can, in certain instances, make signals slower. In certain embodiments, the SDRAM and Flash memory signals are not shared, due to board design complexity of sharing such signals.

Each Xilinx® FPGA has associated memory and interfaces, including two radiation-tolerant 256 MB SDRAM memories, two legacy space-rated QuadRX interfaces for receiving information, two legacy space-rated QuadTX interfaces for sending information, and two multi-point low voltage data signaling (LVDM) buses for connecting the Xilinx® FPGA to a connector such as a stacking connector. In the illustrated embodiment, the stacking connector is a 122 pin connector. C&DH applications for the Xilinx® FPGAs run on the 256 MB SDRAM memories.

Figure 7:
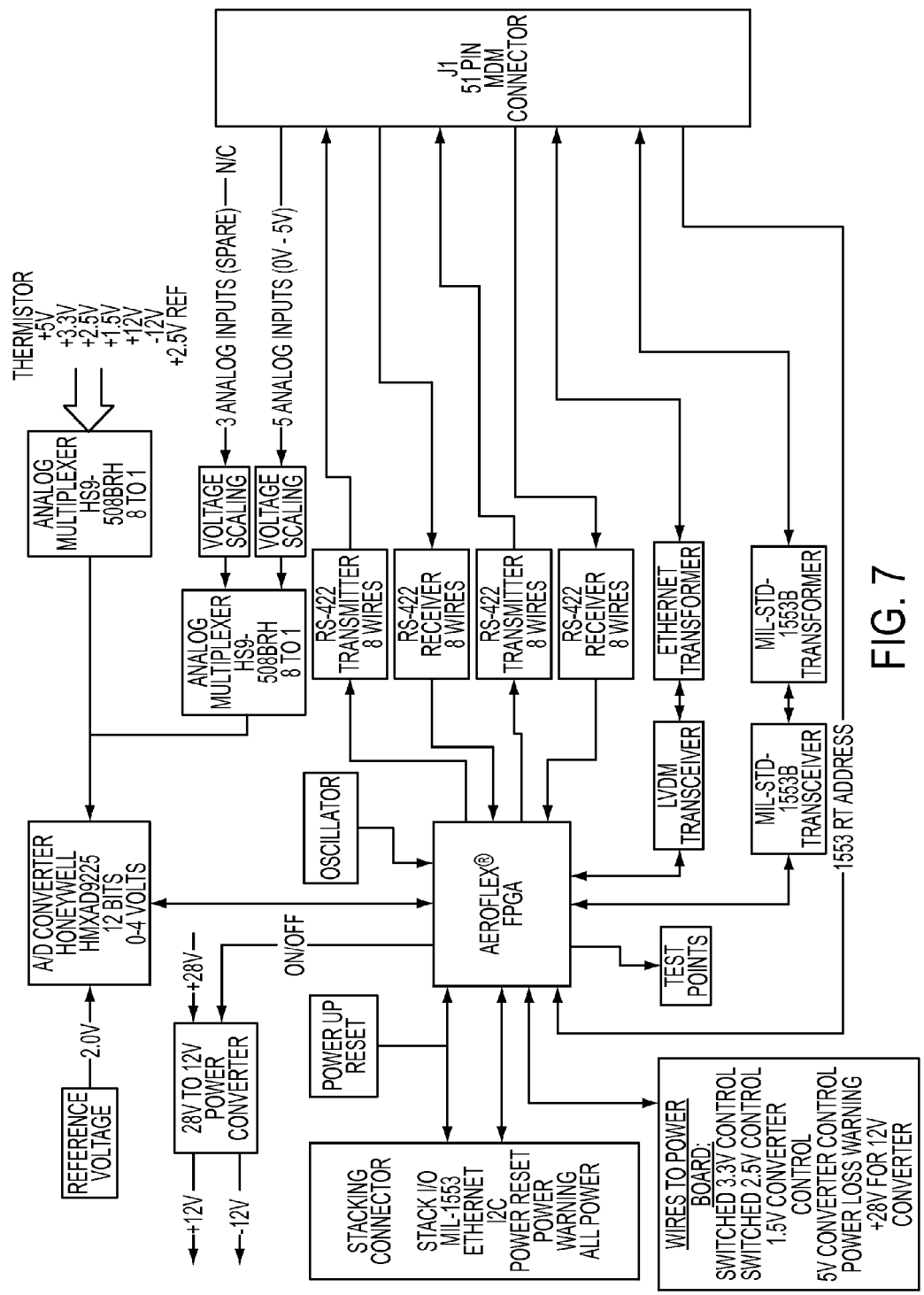
FIG. 7 is a schematic diagram illustrating an exemplary embodiment of a DCC power distribution card in the power slice of FIG. 6.
Figure 8:
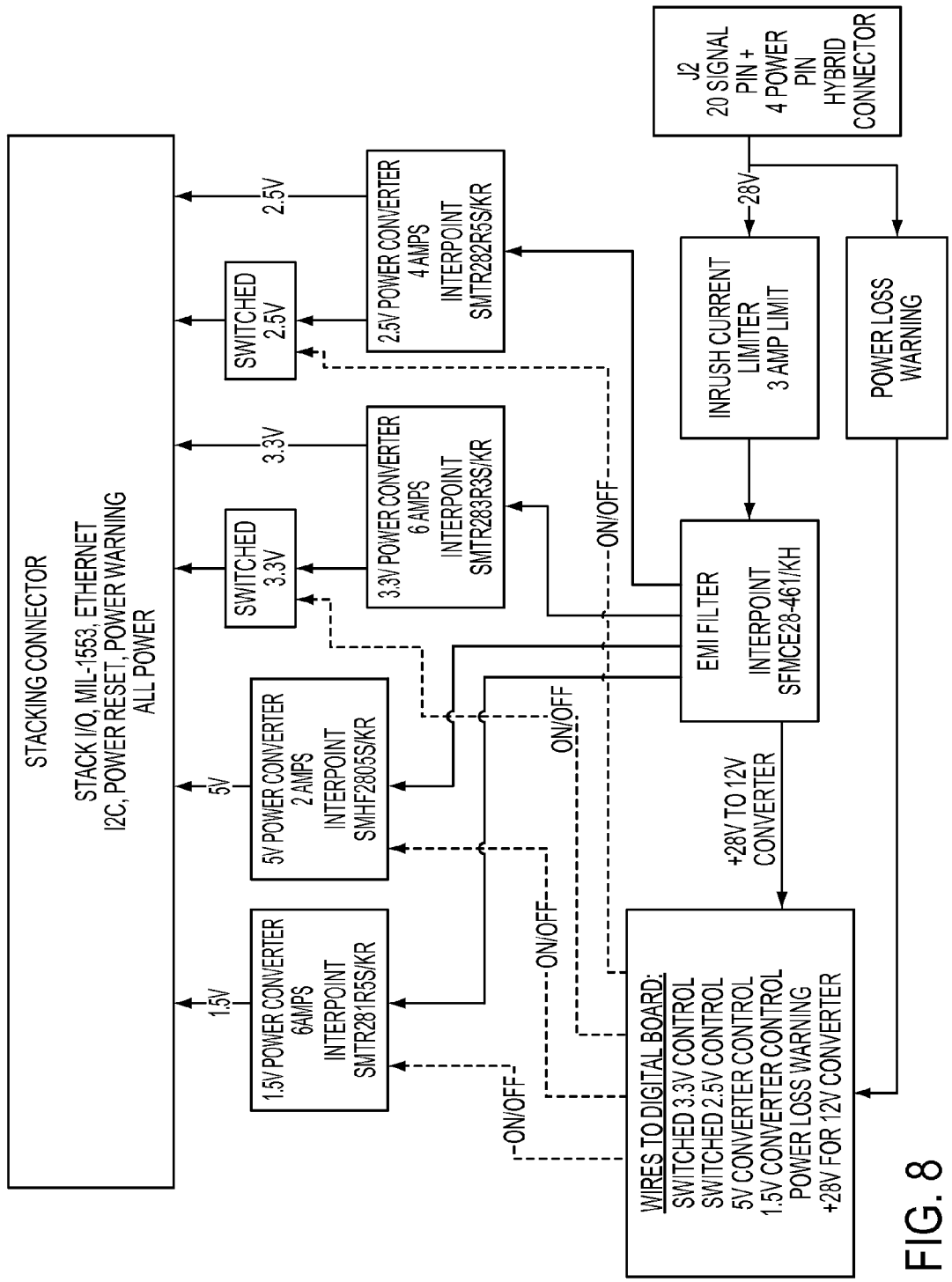
FIG. 8 is a schematic diagram illustrating an exemplary embodiment of a LVPC power converter the power slice of FIG. 6.

The processor card also includes two radiation-hardened FPGAs, for example, the illustrated Aeroflex® UT6325 one-time programmable FPGA. Hereinafter, the Xilinx® FPGAs will be referred to as FPGAs and the Aeroflex® FPGAs will be referred to as Aeroflex® processors. FIGS. 7 and 8 are schematic diagrams illustrating embodiments of Aeroflex® processor cards for power distribution in Two Aeroflex® radiation-hardened processors are provided in the illustrated embodiment to provide necessary processing power for the desired processing system functionality. The Aeroflex® processors can be connected by a bus and are preferably mounted in a back-to-back configuration, such that all or substantially all of the connectors are shared to minimize the space and volume of the installation and obtain computational efficiencies. One Aeroflex® processor can act as a processor FPGA and the other Aeroflex® processor can act as a peripheral FPGA, and the combined Aeroflex® processors can be treated as a single monitor FPGA. One skilled in the art will understand that the number of radiation-hardened FPGAs can vary based on an individual FPGAs processing power and the total processing needs of the system. In accordance with certain embodiments of the present teachings, one of the illustrated Aeroflex® processors includes an 8-bit radiation-hardened microcontroller. The 8-bit microcontroller can monitor the PowerPC® processors, patch Xilinx® FPGA configuration files by accessing stored copies, and reset the PowerPC® processors.

The system further includes two 512 MB Flash memories that are radiation tolerant but not space rated. The radiation-tolerant 512 MB Flash memories can store configuration files for the Xilinx® and Aeroflex® processors, as well as data that the Xilinx® FPGAs generate and use (e.g., telemetry data and application files). Three legacy space-rated QuadRX receivers are provided for the Aeroflex® processors and three legacy space-rated QuadTX transmitters are provided for the Aeroflex® processors.

The processor card illustrated in FIG. 1 also comprises a radiation-hardened memory, such as a 16K SRAM. The PROM stores the 8-bit microcontroller's primary C&DH application. In use, the Aeroflex® processors can access the C&DH application from the PROM and run the C&DH application in the SRAM. The Aeroflex® processors can then check the 512MB Flash memory to see if there are nay updated applications to run.

A processor card in accordance with the present teachings preferably maintains a small form factor, such as a volume of less than about 4"×4"×7". The processor card requires about 7 Watts of power and provides a total of 1 GB of SDRAM memory, 1 GB of Flash memory, 16 KB of SRAM memory, and 16 KB of PROM memory.

A processing system in accordance with the present teachings can be programmed to perform a particular desired function prior to being connected to a receiving device or platform, and preferably is also field programmable and reprogrammable. Thus, once connected to the receiving device or platform, the processing system can be programmed and/or configured as needed. In certain embodiments, changes to the programming and configuration of the processing system can be carried out after the receiving device or platform has been deployed.

Those skilled in the art will understand that different types of radiation-tolerant FPGA devices can be substituted to obtain a field programmable and/or reconfigurable radiation-tolerant processing system. In addition, different radiation-hardened components can be utilized to obtain a processing system that can detect and mitigate single event upsets, such as bit flip and "bad pixel" errors, to avoid radiation-induced errors.

The Aeroflex® processors can serve as a watchdog circuit, waiting for a periodic watchdog packet from each of the PowerPC® processors and, if a watchdog packet is not received within a predetermine time period, resetting the PowerPC® processor from which the expected watchdog packet was missing.

Figure 2:
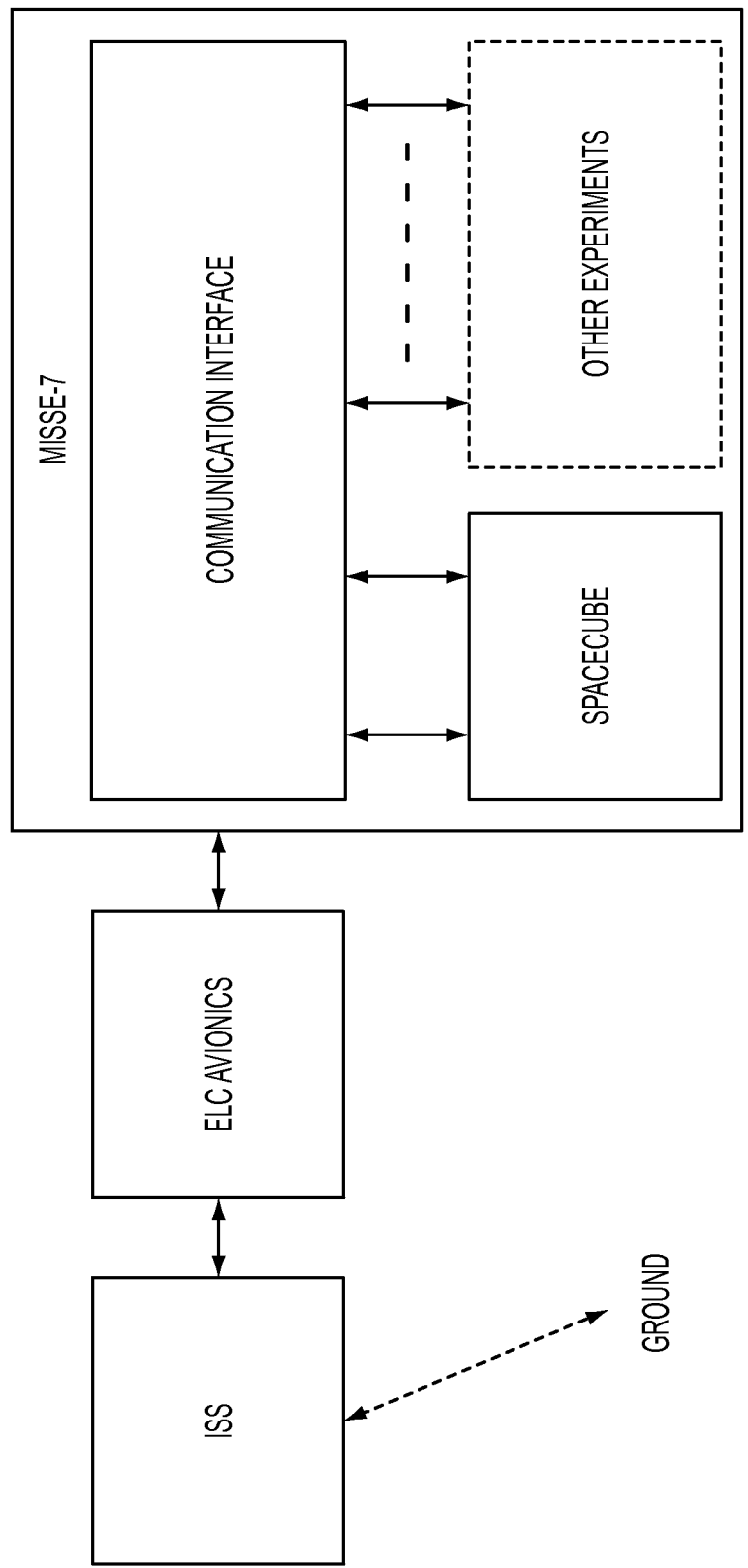
FIG. 2 is a schematic diagram showing an embodiment of a communication scenario among a processing system, an external platform, and a remote station.

FIG. 2 illustrates how one or more processor cards such as the processor card illustrated in FIG. 1 can be employed in an external platform such as MISSE-7. The processor card(s) can be stacked in a payload (labeled SpaceCube in FIG. 2 and shown in more detail in FIG. 3) and can interface with a Communication Interface of the MISSE-7 to exchange data with a ground station via, for example, an ExPRESS Logistics Carrier (ELC) avionics module on the International Space Station (ISS). Indeed, such a communication scenario is supported by the SpaceCube payload being carried by the MISSE-7, which is attached to an ELC avionics module that is mounted to the International Space Station. One skilled in the art will appreciate that other communication scenarios will be desirable when a processor card in accordance the present teachings is employed with different external platforms.

Figure 3:
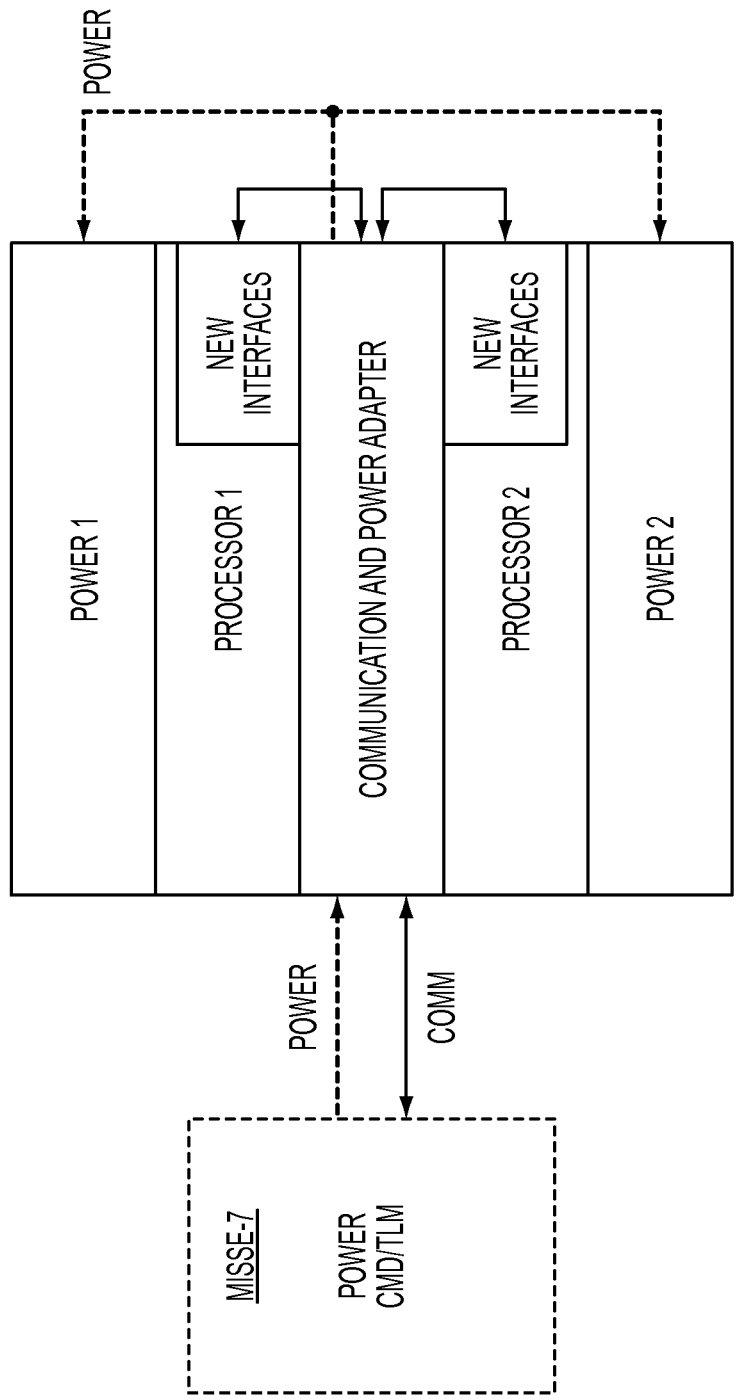
FIG. 3 is a schematic diagram illustrating an exemplary stacking of payload slices in accordance with the present teachings.

FIG. 3 is, for a payload of stacked slices of processor cards employed in the MISSE-7 external platform, a schematic diagram illustrating an embodiment in which stacked slices of processor cards can communicate with the MISSE-7 platform. In the illustrated embodiment, two independent sets of slices are provided. The first set is Power 1 and Processor 1 and the second set is Power 2 and Processor 2. The slice sets are treated as independent experimental processing systems, but are provided only one port to receive power from and communicate with the external platform. A Communication and Power Adapter slice is also provided, and is shown separating the independent sets of slices. The Communication and Power Adapter can communicate with Processor 1 and Processor 2 via designated communication lines with interfaces that allow the external platform to switch between running the Power 1/Processor 1 slice set and the Power 2/Processor 2 slice set. This allows the two independent sets of slices to communicate via and receive power from a single port connecting the payload to the external platform, and also allows one of the independent sets of slices to continue running even if the other independent set of slices goes down.

The Communication and Power Adapter, can itself include a processor card as illustrated in FIG. 1. The processor card for this slice of the illustrated stacked payload is configured to perform the functions necessary to share the single port between the independent sets of slices, to switch between running the independent sets of slices, and to provide adapter functionality for communications and power distribution. The Communication and Power Adapter provides an interface between the independent sets of slices and the MISSE-7 Power CMD/TLM.

In certain embodiments of the implementation illustrated in FIG. 3, each of Power 1 slice and Power 2 slice include two processor cards, aspects of which are illustrated in FIGS. 7 and 8. Thus, the five illustrated stacked slices can include seven processor cards. In such an embodiment, the payload can have dimensions of about 4"×4"×7.2", with processor slices having dimensions of about 4"×4"×1.1" and power slices having dimensions of about 4"×4"×1.8". One skilled in the art will understand that additional redundant independent sets of slices can be provided and accommodated in accordance with the present teachings, and even a single set of slices is within the scope of the present teachings. FIGS. 7 and 8, described below, provide more detailed information regarding an exemplary power distribution.

Figure 4:
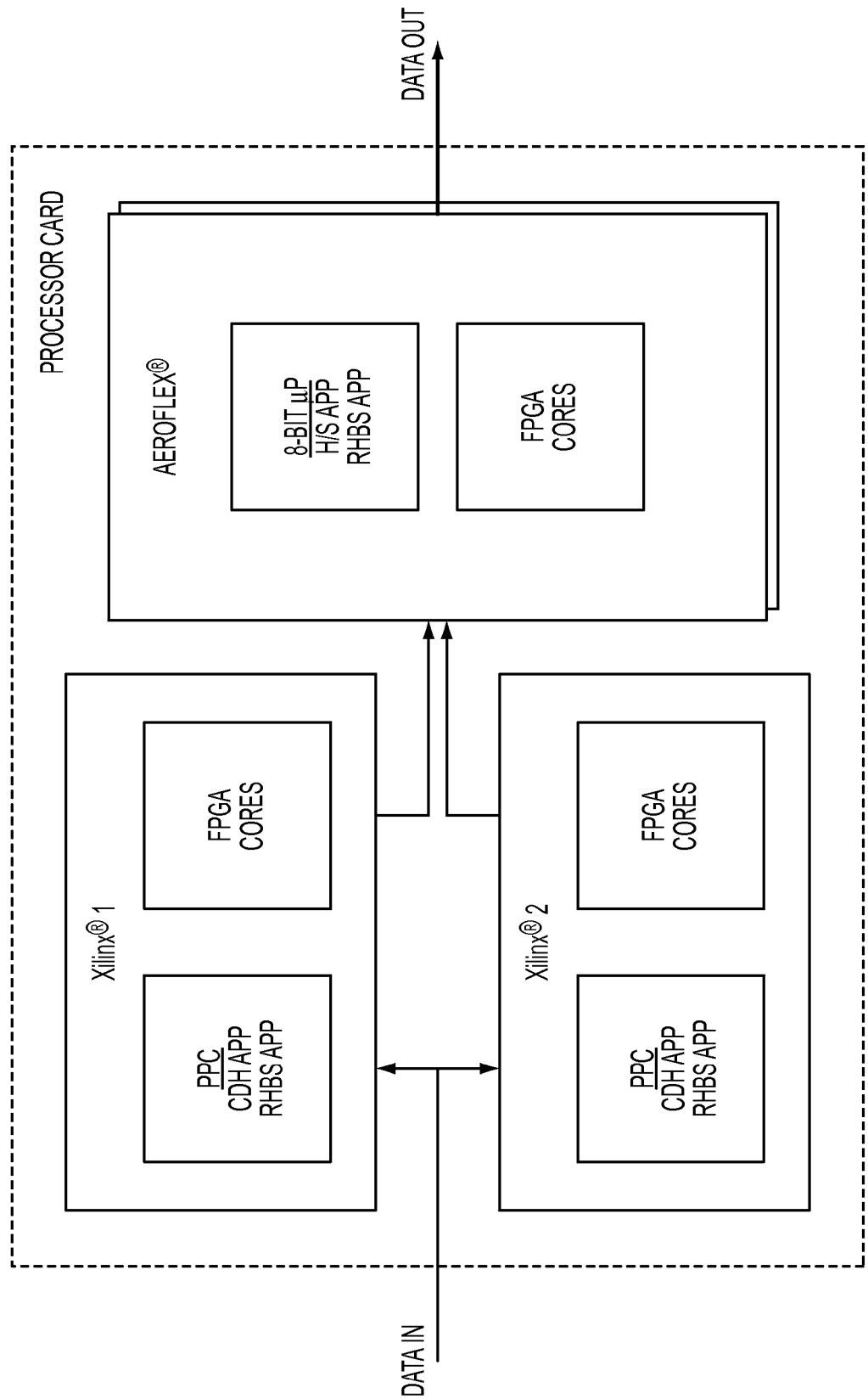
FIG. 4 is a schematic diagram of an embodiment of a processing system according to the present teachings.

FIG. 4 is another schematic diagram illustrating a processor card in accordance with the present teachings. The two Xilinx® FPGAs are labeled Xilinx 1 and Xilinx 2. Although each Xilinx® FPGA includes two PowerPC® processors, a single PPC box is shown. Each Xilinx® FPGA also includes a FPGA core. A CD&H application and a radiation hardening by software application are provided on one PowerPC® processor of each Xilinx® FPGA. The other PowerPC® processor in each Xilinx® FPGA receives and processes incoming data such as, for example, predetermined data for field testing or data from a variety of environmental sensors. The Xilinx® FPGAs receive the same data and process the data in the same way, so that each Xilinx® FPGA should output the same data. Processed data is sent from the Xilinx® FPGAs to the Aeroflex® processors, which compare data received from the Xilinx® FPGAs to determine whether the Xilinx® FPGAs have output the same data. If the data output by the Xilinx® FPGAs is the same, the system can determine that the Xilinx® FPGAs are processing data and mitigating data errors so that they are performing as well as a space-rated radiation-hardened processor.

The 8-bit radiation-hardened microcontroller is illustrated in FIG. 4, and includes both a health and safety (H/S) application and a radiation hardening by software (RHBS) application that assists the radiation hardening by software application on the Xiline FPGA by identifying and mitigating erroneous data received from the Xilinx® FPGAs. At least one of the Aeroflex® processors also includes an FPGA core that provides an efficient interface with each Xilinx® FPGA core. Data output from the Aeroflex® processors can include verified processed data from the Xilinx® FPGAs.

In accordance with certain embodiments, data output from the Xilinx® FPGAs is checked by the Aeroflex® processors, and a copy of the output data from both Xilinx® FPGAs is stored on each of the 512 MB Flash memories. Thus, there are 4 instances of the FPGA output data on the 512 MB Flash memories, because each FPGA's data is stored in both of the 512 MB Flash memories.

Figure 5:
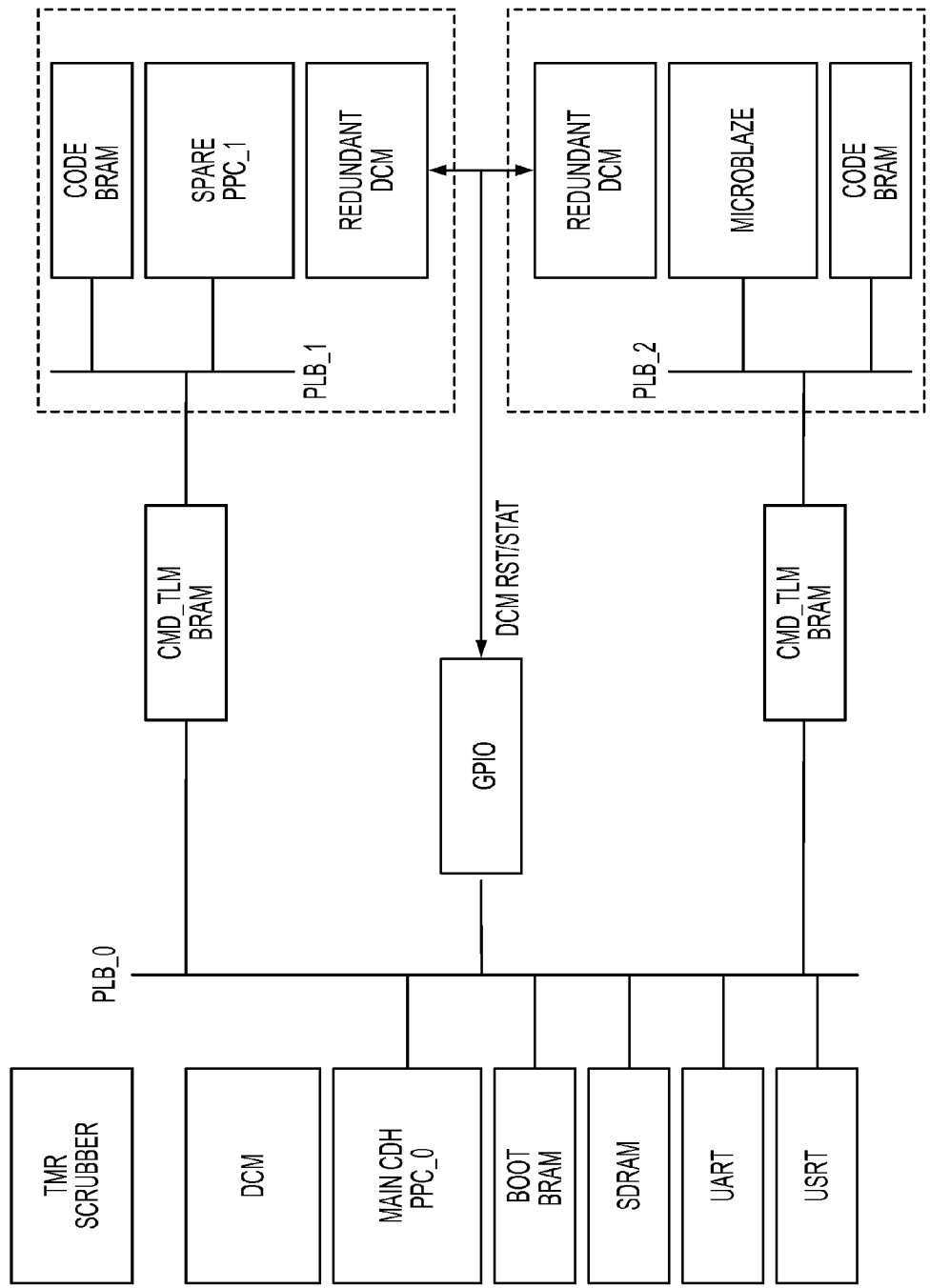
FIG. 5 is a schematic diagram illustrating a field programmable gate array (FPGA) architecture according to an embodiment of the present teachings.

FIG. 5 is a schematic diagram illustrating an embodiment of a Xilinx® FPGA used in a processing system of the present teachings. As shown, each Xilinx® FPGA can be functionally "split in half" so that one "half" of the Xilinx® FPGA runs a C&DH application and the other "half" of the FPGA acts as two scratch pad areas that can be configured to process and output data in a predetermined manner. For field testing a radiation hardening by design and software implementation, both scratch pad areas are preferably configured to receive the same data and perform the same function, and thus output the same data. Dual port RAM in the Xilinx® FPGA allow the C&DH portion of the Xilinx® FPGA to monitor the health of the scratch pad areas, because data written by the scratch pads areas to the dual port RAM memory locations can be compared by the C&DH portion of the Xilinx® FPGA. Dual port RAM has the ability to simultaneously read and write different memory cells at different addresses.

In the embodiment of FIG. 5, one of the PowerPC® processors, labeled Main CDH PPC_0, runs the C&DH application. The other PowerPC® processor, labeled Spare PPC_1, processes the predetermined test data (or live sensor data in some embodiments) and outputs the processed data to the C&DH application. A third processor, a 32-bit "soft" RISC processor, labeled MicroBlaze, performs the same processing on the same data as Spare PPC_1, and outputs the processed data to the C&DH application. The two scratch pad areas each include a processor, RAM such as block RAM (BRAM) provided in the Xilinx® FPGA, and a digital clock manager. The digital clock managers of the two scratch pad areas are monitored by the C&DH application via a general purpose input/output (GPIO) to ensure that the scratch pad areas are running properly. The GPIO can perform a DCM reset if needed.

Data processed in each of the scratch pad areas can be sent to the C&DH system via the illustrated respective CMD_TLM BRAMs, which can also be used to send commands from the C&DH system to the scratch pad areas. Each processor (including the soft RISC processor) has its own processor local bus (PLB) to provide transportation for data flow.

The C&DH system includes a digital clock manager (DCM), boot BRAM, access to the 256 MB SDRAM of the processor card for accessing and storing program files and data, a UART providing a connection to the external platform via the Aeroflex® processors, and a USRT. When the C&DH PowerPC® processor comes out of a reset, it can initially read from the C&DH boot BRAM and then begin communication with the Aeroflex® processors via the USRT. The C&DH system can, for example, send command data to SDRAM, and telemetry data from both scratch pad areas to the SDRAM.

One skilled in the art will appreciate that the "half" of the FPGA described above for use as scratch pad areas could alternatively be used to perform other functions in a payload utilized in other missions. For example, the scratch pad areas could be reconfigured to perform target recognition and/or control for a space station robotic arm if the payload was physically interfaced with appropriate sensors or a robotic arm, respectively. The scratch pad areas of the Xilinx® FPGA, even if used for another function, could still perform the same function and write to the dual ports for a C&DH check if desired by the user.

In various embodiments, the data output by the Xilinx® FPGAs is checked by one or more operators monitoring performance of the payload from, for example, a ground station. Such monitoring is desirable because feasibility and performance of the radiation hardening by design and software capability of the implementation is being tested. Alternatively or additionally, however, a processor at the ground station can perform a comparison of the output data, or the radiation-hardened Aeroflex® processors can perform the comparison within the payload. In certain embodiments, the Aeroflex® processors can detect data errors and mitigate the data errors before storing or transmitting data.

As shown in FIG. 5, each Xilinx® FPGA can include a triple modular redundancy (TMR) scrubber. TMR is a common reliability technique for mitigating single-event upsets in FPGA designs operating in hostile environments. A variety of FPGA configuration memory scrubber implementations are possible. In the illustrated embodiment, a TMR scrubber sits in each Xilinx® FPGA and reads back its own configuration file to make sure its configuration file does not become corrupted.

Figure 5A:
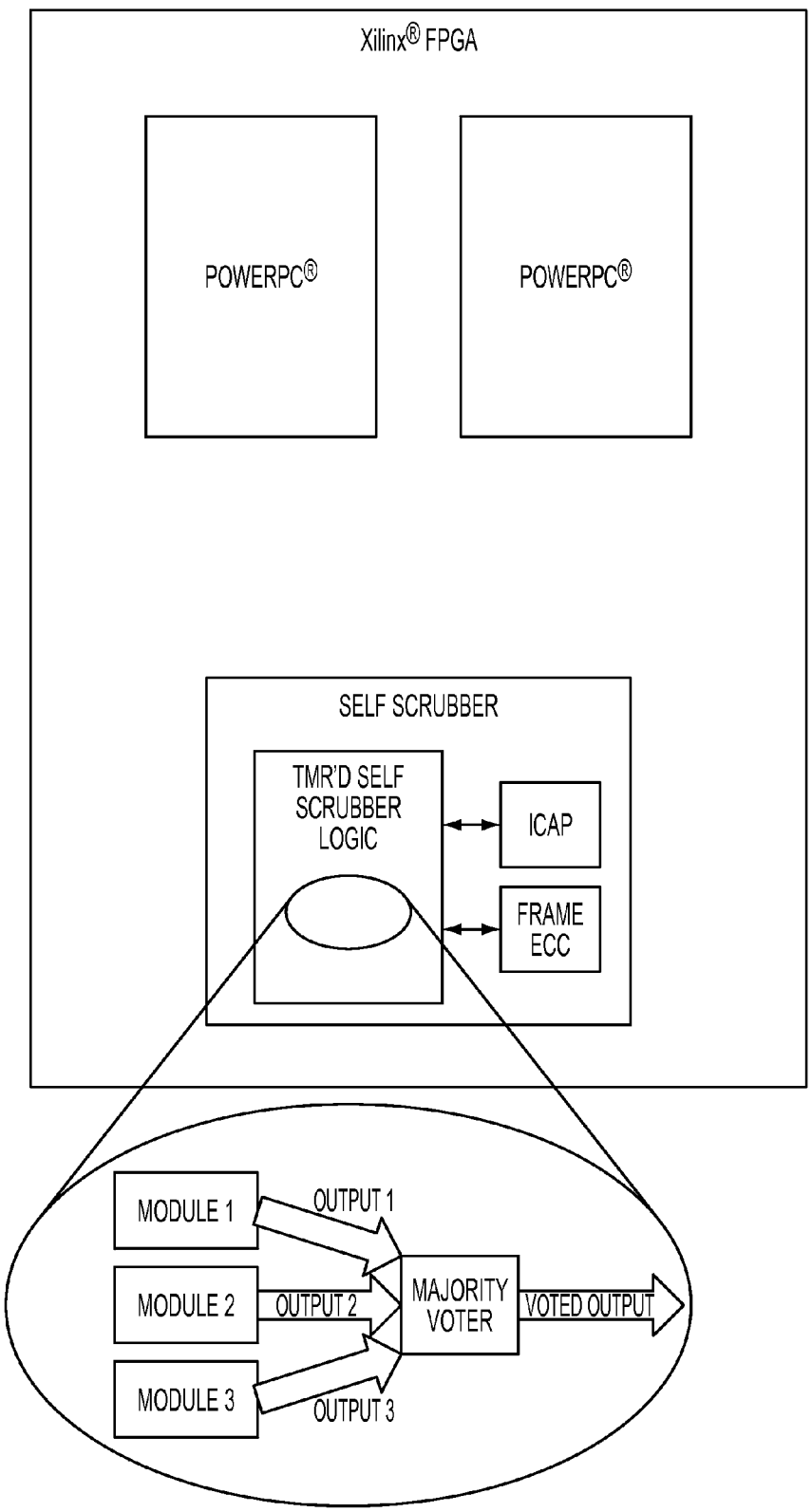
FIG. 5A schematically illustrates an exemplary self-scrubber for an FPGA.

FIG. 5A schematically illustrates an exemplary self-scrubber of the Xilinx® FPGA that employs TMR self-scrubber logic. As shown, the self scrubber logic can read three versions of data (e.g., Module 1, Module 2, Module 3, representing a configuration file) and vote on a "voted output" based on the three versions of the data. In certain embodiments of the invention, the self scrubber logic runs continuously, checking and re-checking data.

Figure 5B:
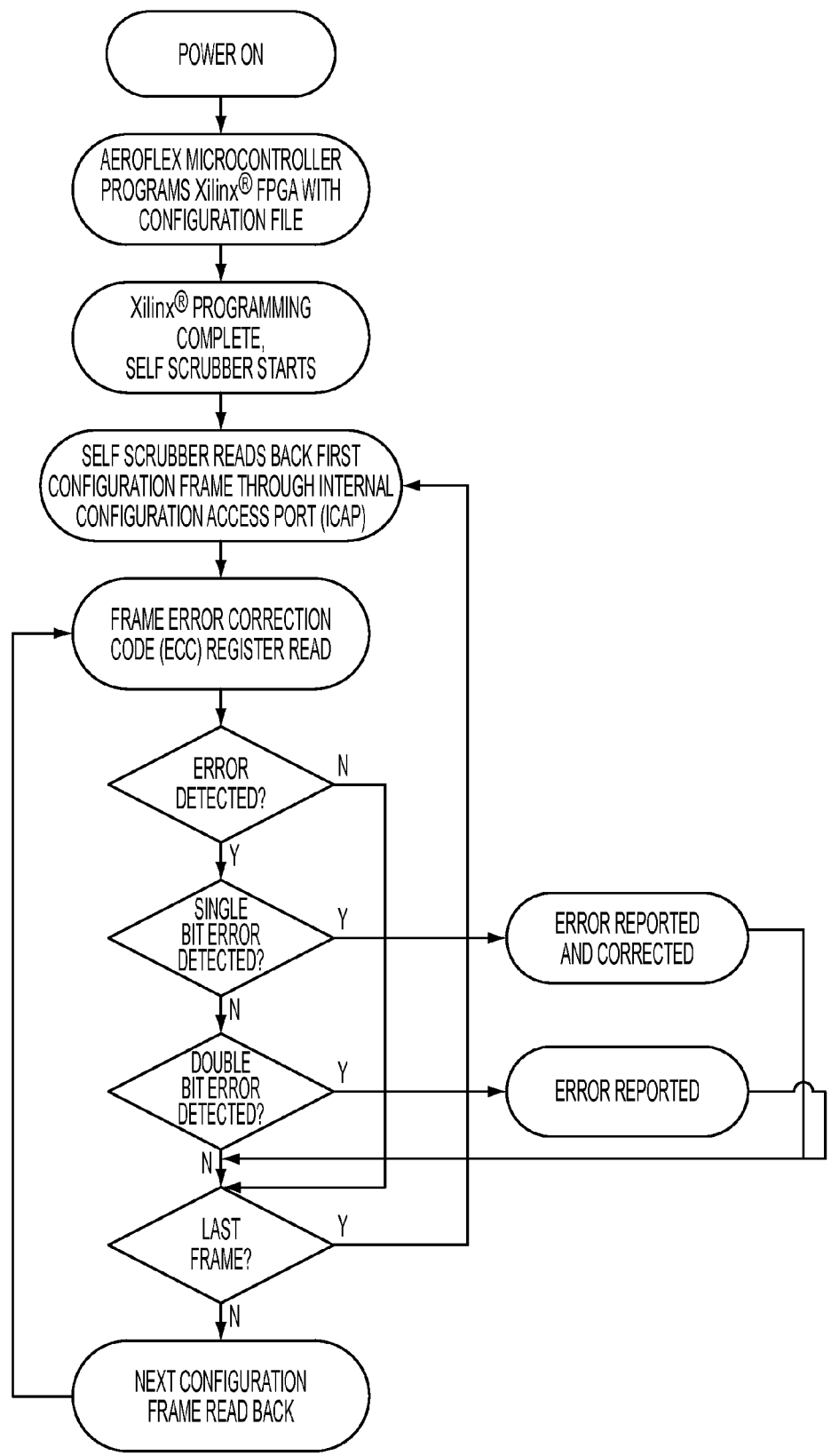
FIG. 5B is a flow chart illustrating an exemplary embodiment of a self scrubbing routine that can be employed in accordance with the present teachings.

FIG. 5B is a flow chart illustrating an exemplary embodiment of a self scrubbing routine that can be employed in accordance with the present teachings. Upon powering up the system, the Aeroflex® microcontroller programs the Xilinx® FPGA with its configuration file. Once the Xilinx® FPGA programming is complete, the self scrubber can start running. The self scrubber reads a first configuration frame via, for example, an internal configuration access port (ICAP) (see FIG. 5A) and performs a frame Error Correction Code (ECC) register read for that frame. If no error is detected, the self scrubber routine checks to see if the frame is the last frame of the configuration file. If the frame is not the last frame of the configuration file, the routine reads a next frame of the configuration file and performs a frame ECC register read. If the frame is the last frame, the routine goes back to reading the configuration file and running through it again in a continuous cycle.

If an error is found during a frame ECC register read, if a single bit error is detected, the error is reported and corrected and the routine can proceed with determining whether the frame is a last frame and proceed accordingly. If a double bit error is detected, the error is reported and the routine can determine if the frame is the last frame and proceed accordingly. While single bit errors can be corrected in a system of the present teachings, double bit errors cannot be corrected. An error of more than two bits cannot be detected or corrected.

Figure 6:
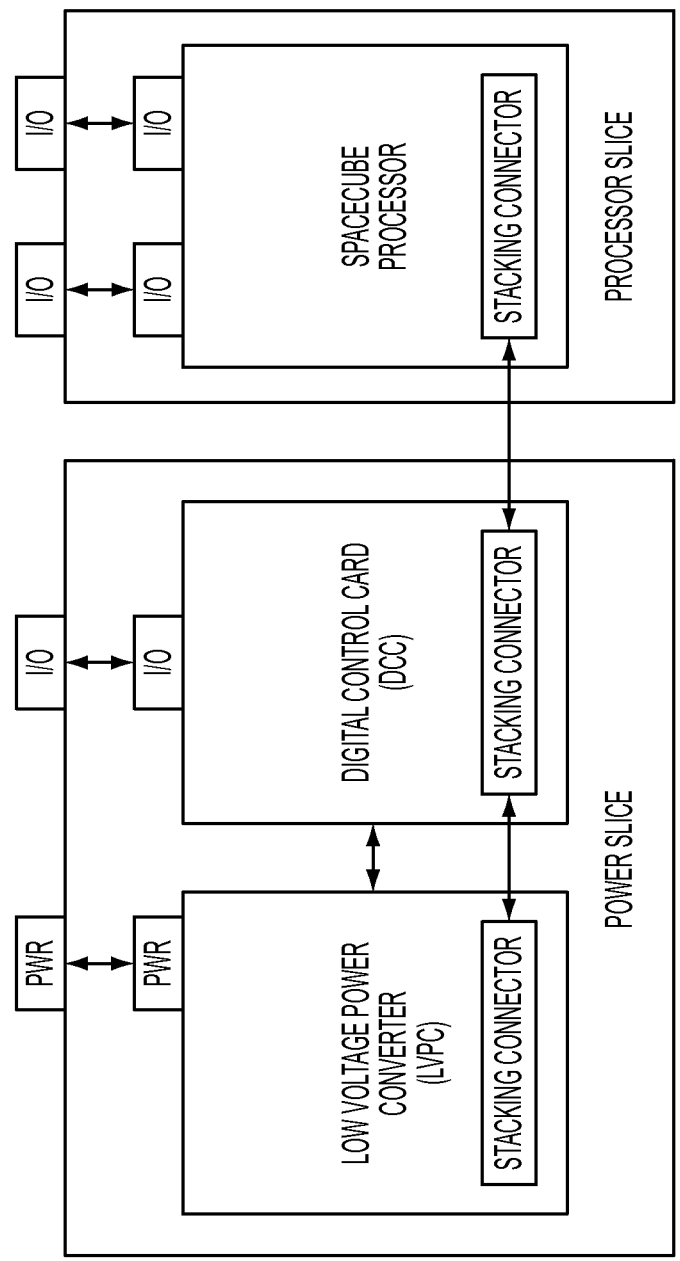
FIG. 6 is a schematic diagram illustrating an embodiment of an independent set of processor card slices.

FIG. 6 is a schematic diagram illustrating an embodiment of an independent set of processor card slices. As shown, the power slice of the independent set includes two processor cards, a low voltage power converter (LVPC) and a digital control card (DCC), connected to each other via stacking connectors and connected to an associated processor slice via a stacking connector. The DCC processor card controls power distribution from the Communication and Power Adapter slice (see FIG. 3), and is illustrated in more detail in FIG. 7. The LVPC power converter is shown in more detail in FIG. 8.

FIG. 7 illustrates an exemplary embodiment of a DCC power distribution card. A stacking connector is shown, supporting a variety of communication protocols including I2C, and being configured to provide power, power reset, and power warning signals. The illustrated Aeroflex® processor can be connected to a power board configured to allow the Aeroflex® processor to turn on/off the Xilinx® FPGAs (e.g., via switched 2.5V and 3.3V control), control power-up of the Xilinx® FPGAs (e.g., via 1.5V and 5V converter control), provide a power loss warning, and convert a 28V input power to 12V power. The Aeroflex® processor can additionally utilize a test point module, for example, when the card is being tested prior to use, to check various voltages and signals. Further, a first transceiver such as MIL-STD-1553 and a first transformer such as a MIL-STD-1553B transformer can be provided between the Aeroflex® processor and a J1 connector, for example, a 51 pin MDM connector. A second transceiver such as a low voltage multipoint data signaling (LVDM) transceiver and a second transformer such as an Ethernet transformer can also be provided between the Aeroflex® processor and the J1 connector.

Two legacy RS-422 transmitters and two legacy RS-422 receivers can connect the Aeroflex® processor with the J1 connector. The J1 MDM connector can be used in this DCC, for example, for debugging from the ground or other base of operation. The Aeroflex® processor can receive a reference voltage and input from analog multiplexers via an A/D converter for voltage monitoring of all power created by the power slice in which it resides. The Aeroflex® processor can also send on/off signals to a power converter. A −12V output of the power converter can be used, for example, on the processor card for a MOFSET that generates the 1.2V for the FPGAs FIG. 8 illustrates an exemplary embodiment of a LVPC power converter. A stacking connector is shown, supporting a variety of communication protocols including I2C, and being configured to provide power, power reset, and power warning signals. Wires to the DDC are shown, and are configured to allow the Aeroflex® processor to turn on/off the Xilinx® FPGAs (e.g., via switched 2.5V and 3.3V control), control power-up of the Xilinx® FPGAs (e.g., via a 1.5V and 5V converter control), provide a power loss warning, and convert a 28V input power to 12V power. Communication of on/off controls from the DDC to the stacking connector is illustrated via broke arrows. Power can be received from MISSE-7 and routed to the illustrated J2 connector via the payload's communication and power adapter slice. Incoming power is routed for distribution through an inrush current limiter, for example, having a 3 Amp limit, which acts as a fuse to cut off power if the board tries to use too much power. Incoming power is also routed through an EMI filter, which cleans the power signal in a known manner. A power loss warning can be sent from the J2 connector to the DDC.

In addition to providing a demonstration platform, embodiments of the present teachings disclosed herein provide a processing system comprising radiation-tolerant FPGAs, which can be added to an existing platform to increase its computational performance without the need to design and test a customized processor. An in-flight reprogrammable logic structure can provide the ability to change the operation of the processing system after assembly of the processing system in a platform, and/or after deployment of the platform.

Certain embodiments of processing systems in accordance with the present teachings support reconfiguration and compressed uploads. Thus, new program files can be sent from a remote location (e.g., a ground control center) and received by the Xilinx® FPGA (in which a checksum can be performed) in an embodiment where all data has been designed to be input via the Xilinx® FPGAs. The new program files are sent to the Aeroflex® processors (where another checksum can be performed) and then stored in Flash memory. The new program files can be executed via ground commands sent to the Xilinx® FPGAs. If the new program files are received by the processing system as compressed files, the compressed program files can be received and decompressed by the PowerPC® processors, for example, when a decompress command is received. The decompressed program files can be stored in memory, for example, the illustrated 512 MB Flash memory, and then a reconfiguration command can be sent to cause reconfiguration of one or both of the FPGAs with the decompressed program files. The reconfiguration command can be received by Xilinx® FPGAs and sent to the Aeroflex® processors.

A processing system according to the present teachings can include radiation-tolerant components that are monitored by a radiation-hardened microprocessor, so that the radiation tolerant components can operate in a radioactive environment with minimal errors in data being processed. For example, in accordance with various embodiments of the present teachings, radiation hardening by design can be achieved by employing radiation-tolerant reconfigurable processors to process data concurrently and comparing the data output by the radiation-tolerant reconfigurable processors to identify possible errors (inconsistent data), and additionally having a radiation hardened processor oversee the operation and error-checking of the radiation tolerant processors, resulting in mitigation of most or all upsets.

In addition, in accordance with certain embodiments, radiation hardening by software can be employed to mitigate a majority of the remaining upsets. In the context of the present teachings, radiation hardening by software refers to the use of functions or software applications that are executed to identify radiation-induced errors occurring in the radiation tolerant processors, and to take an appropriate corrective action.

Processing systems in accordance with the present teachings must be able to withstand hostile environmental conditions. For example, radiation can have serious negative effects on CPUs, memory components, and other electronic parts that are typically included in a processing system. Bombardment by neutrons, gamma rays, alpha particles, and other particles and electromagnetic waves can cause damage (i.e., destructive errors) to the processing system or transient errors (e.g., bit flips) in CPUs and memory elements. Devices used in space are particularly subject to damage and errors from radiation, due to the strong radiation fields present outside the Earth's atmosphere. Many sensor platforms, instruments, and other devices can be subject to similar damage from natural or man-made radiation. Radiation is meant to include both electromagnetic waves such as X-rays, gamma rays etc., and particles such as neutrons, electrons, alpha particles and other that can cause damage to computing elements by ionization or other mechanisms.

One exemplary application of a processing system according to the present teachings is in remote platforms carrying science instruments that are capable of acquiring large quantities of data, which then has to be transmitted to a distant station and/or stored (and perhaps processed) on board. An example of this arrangement is found in a space probe sending data back to Earth. The data transmission step may be difficult or expensive in terms of power required, available bandwidth, usable connection time, or other parameters. Data storage can be limited by the available memory. The sensors used in a space-based platform can include, for example, synthetic aperture radar, hyper-spectral instruments, and other instruments to monitor weather, environmental trends, global warming and other parameters. For a processing system according to the present teachings that will be used as a demonstration platform to test feasibility and performance of the system's radiation by software capabilities, the data processed can be a known, predefined data set that is input to the FPGAs when they are operating in a hostile environment, or the data can be live data from sensors available on the external platform that are able to send data to the processing system. In either scenario, storage, processing, and transmission or large amounts of data may need to take place.

In certain devices or platforms utilizing a processing system in accordance with the present teachings, transmitting or storing all of the data generated by the sensors on the device or platform may not be practical, and an arrangement where some or most of the data processing is carried out before transmission or storage may be advantageous to reduce the amount of data that will need to be transmitted or stored.

A processing system in accordance with the present teachings can have sufficient processing power to process data before the data is stored or transmitted to a remote station, and can select data to transmit, prioritize, compress and otherwise manipulate before transmission or storage thereof. Such onboard lossless data reduction can allow migration of typical ground-based processing functions to the external platform, resulting in a significant reduction in on-board data storage and downlink requirements.

Confirming the feasibility and performance of radiation hardening by design and software in a processing system according to the present teachings can allow commercially-available radiation tolerant electronic parts to be used in a processing system deployed in a hostile environment and accurately monitored for errors, and therefore can allow newer processors, memories, and other components can be incorporated as they become available.

Providing a radiation-tolerant FPGA can eliminate about 95% of the radiation mitigation issues that can affect conventional systems used in hostile environments, particularly single-event errors. However, in the case of a FPGA containing embedded processors such as, for example, PowerPC® processors, radiation-induced upsets may still affect the embedded processors and associated memory, and cause single-event upsets such as bit-flips. Radiation hardening by software primarily protects the embedded processors. Radiation hardening by software can include, for example, providing data corruption indicia to identify incorrect results of computations carried out, for example, in the embedded processors, and causing the computations to be repeated when necessary due to incorrect results.

As will be understood by those skilled in the art, the data corruption indicia can include a checksum function or error detection and correction (EDAC), or other known methodologies to rapidly determine whether two computations give identical results. For example, a dedicated memory of the processing system may be used to store programming instructions that, when executed, by a processor, result in at least a part of the radiation hardening by software procedure. Alternatively, programming instructions may be provided when reconfiguring the device. The programming instructions can be stored at least in part in other memory components of the processing system according to embodiments of the present teachings.

Verifying data corruption indicia utilizing certain embodiments of the present teachings can require only two processors to carry out identical computations and verify the results. This compares well with the at least three processors necessary in a conventional redundant apparatus with an arbiter circuit. Instead of executing three identical computations and discarding the one that gives a different result, the present teachings envision comparing the checksums (or other data corruption indicia) of two identical computations, and repeating the computation if the checksums are different.

Embodiments of a processing system in accordance with the present teachings that utilizes live sensor data can include a digital signal processor (not shown) adapted to carry out digital processing of sensor signals. For example, the signals can include data generated by a sensor platform, which data can be processed or otherwise manipulated before being stored in memory and/or transmitted to a distant station. The digital signal processor can, for example, carry out analysis, compression, selection, or other processes that can be adapted to reduce the amount of information stored or transmitted. Additional functions can be carried out by the digital signal processor, as directed by the FPGA or by instructions from outside the device.

Figure 9:
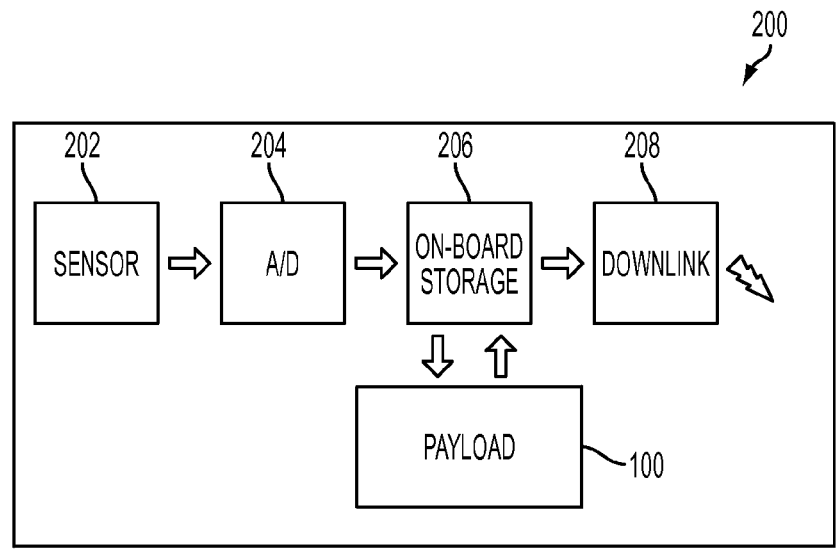
FIG. 9 is an exemplary configuration for integrating a payload including one or more processing systems according to the present teachings into the data flow of an external platform.
Figure 10:
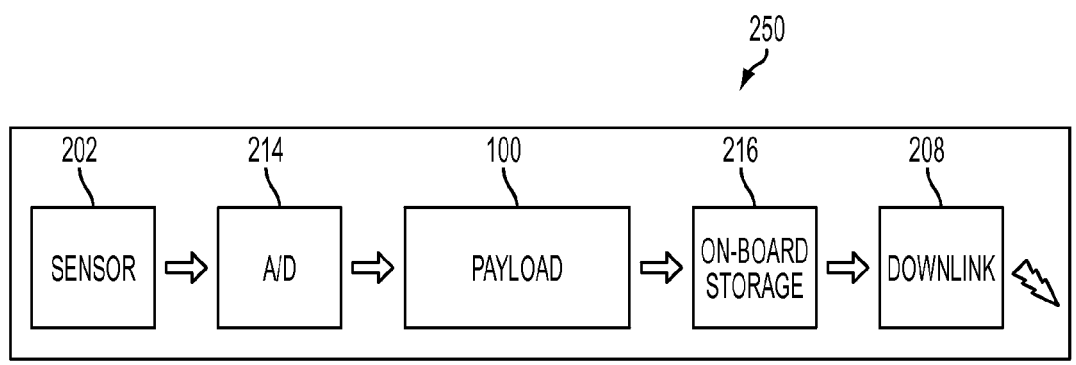
FIG. 10 is another exemplary configuration for integrating a payload including one or more processing systems according to the present teachings into the data flow of an external platform.

For processing system embodiments that use live sensor data as input, FIGS. 9 and 10 show options for integrating a payload 100 including one or more processing systems according to the present teachings into the data flow of an external platform. In a first configuration shown in FIG. 9, a parallel on-board data processor 200 utilizes a processing payload 100 in parallel with the data stream through an on-board storage element 206 of the external platform. In this configuration, one or more sensors 202 generate data, which goes through an Analog/Digital converter 204 before reaching on-board storage 206. The processing payload 100 is not directly in the data collection stream, but is connected to the on-board storage device 206 from which it can read raw data, execute desired algorithms, and generate desired products that can be stored back in the on-board storage 206. The processed data can then be retained in memory and/or transmitted via a downlink 208.

In the configuration illustrated in FIG. 9, processing can occur in near real-time, and upsets such as bit flip errors can be corrected by simply re-executing a processing step when an error is detected, for example, by recognizing data corruption indicia, thus obtaining "perfect data" at the output. This configuration is well suited for use as a retrofit on existing sensor platforms, or on systems where data collection periods are followed at least by a minimal amount of idle time.

In a second system configuration for integrating a processing payload 100, as shown in FIG. 10, the processing payload 100 is connected in line or in series within the on-board data processor 250. Here, the processing payload 100 is directly in the data stream of the device, for example, located between the analog to digital (A/D)

The in-line configuration illustrated in FIG. 10 is capable of processing very high data rates, however may be subject to occasional errors, such as bit-flip errors or "bad pixel" errors due to radiation, if the data rate exceeds the recovery time for re-executing a processing step that is determined to be in error. In cases where the data rate is not extreme, and/or when there are some idle periods in the data collection stream, this configuration is also able to produce data with substantially no errors, by re-executing erroneous steps during the slower or idle periods.

Figure 11:
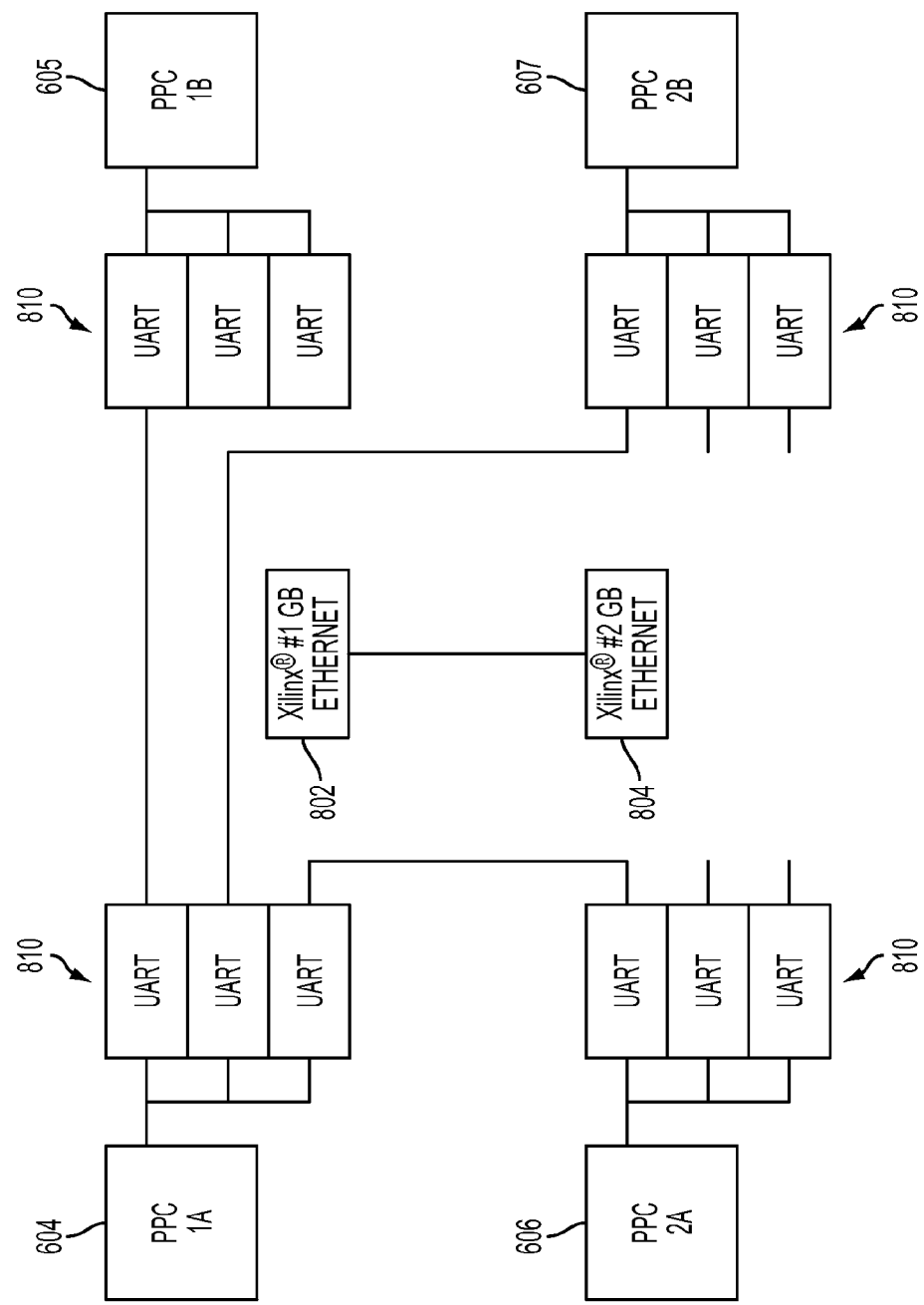
FIG. 11 is an exemplary embodiment of an inter-PowerPC® communication schematic.

An exemplary embodiment of an inter-PowerPC® communication schematic is shown in FIG. 11. In this embodiment, four PowerPC® processors 604-607 are connected to each other by a series of universal asynchronous receiver/transmitters (UARTs) 810. Those of skill in the art will understand that more or fewer UARTs can be used, depending on the communication demands of the sensor platform or other device using the processing system according to the present teachings. The inter-PowerPC® communication scheme may alternatively or additionally utilize Ethernet ports 802, 804 of the FPGAs.

The present teachings have been described with reference to specific exemplary embodiments. Other embodiments of the present teachings will be apparent to those skilled in the art from consideration of the specification and practice of the teachings disclosed herein. It is intended that the specification and examples be considered as exemplary only, with a true scope and spirit of the teachings being indicated by the following claims.

What is claimed is:

1. A processing system, the processing system comprising:
a first radiation-tolerant field programmable gate array having a first dual port RAM memory and configured to be used in a hostile environment, the first radiation-tolerant field programmable gate array comprising:
three functionally distinct portions including:
a first command and data handling portion that provides control processing, data handling and storage, command decoding and telemetry gathering;
a first scratch pad portion that receives a first set of data, processes the first set of data, and outputs a first set of processed data to a first location of the first dual port RAM memory; and
a second scratch pad portion that receives a second set of data identical to the first set of data, processes the second set of data in the same way that the first set of data is processed, and outputs a second set of processed data to a second location of the first dual port RAM memory,
wherein the first command and data handling portion compares the first set of processed data in the first location of the first dual port RAM memory to the second set of processed data in the second location of the first dual port RAM memory and, if the first set of processed data is the same as the second set of processed data, outputs one of the first set of processed data and the second set of processed data;
a second radiation-tolerant field programmable gate array having a second dual port RAM memory and configured to be used in a hostile environment, the second radiation-tolerant field programmable gate array comprising:
three functionally distinct portions including:
a second command and data handling portion that provides control processing, data handling and storage, decoding and telemetry gathering;
a third scratch pad portion that receives a third set of data identical to the first and second sets of data processes the third set of data in the same way that the first and second sets of data are processed, and outputs a third set of processed data to a third location of the second dual port RAM memory; and
a fourth scratch pad portion that receives a fourth set of data identical to the first, second, and third sets of data, processes the fourth set of data in the same way that the first, second, and third sets of data are processed, and outputs a fourth set of processed data to a second location of the second dual port RAM memory,
wherein the second command and data handling portion compares the third set of processed data in the first location of the second dual port RAM memory to the fourth set of processed data in the second location of the second dual port RAM memory and, if the third set of processed data is the same as the fourth set of processed data, outputs one of the third set of processed data and the fourth set of processed data;
a radiation-hardened processor;
a first SDRAM; and
a second SDRAM,
wherein the first command and data handling portion outputs one of the first set of processed data and the second set of processed data to the radiation-hardened processor for storage on the first SDRAM and the second SDRAM, and wherein the second command and data handling portion outputs one of the third set of processed data and the fourth set of processed data to the radiation-hardened processor for storage on the first SDRAM and the second SDRAM.

2. The processing system of claim 1, wherein the first set of data and the second set of data comprise predefined test data.

3. The processing system of claim 1, wherein the first set of data and the second set of data comprise data from one or more sensors in communication with the first radiation-tolerant field programmable gate array.

4. The processing system of claim 1, wherein the third set of data and the fourth set of data comprise predefined test data.

5. The processing system of claim 1, wherein the third set of data and the fourth set of data comprise data from one or more sensors in communication with the second radiation-tolerant field programmable gate array.

6. A method for radiation hardening a processing system by design and software, the method comprising:

within a first radiation-tolerant FPGA of the processing system;

processing a first set of data to create a first set of output data;

processing a second set of data that is identical the first set of data to create a second set of output data;

comparing the first set of output data to the second set of output data to detect errors in the data or the data processing; and storing one of the first set of output data and the second set of output data in a memory of the processing system if no errors are detected; within a second radiation-tolerant FPGA of the processing system;

processing a third set of data that is identical to the first and second sets of data to create a third set of output data;

processing a fourth set of data that is identical the first, second, and third sets of data to create a fourth set of output data;

comparing the third set of output data to the fourth set of output data to detect errors in the data or the data processing; and storing one of the third set of output data and the fourth set of output data in a memory of the processing system if no errors are detected; and comparing stored data from the first radiation-tolerant FPGA to stored data from the second radiation-tolerant FPGA to detect errors in the data or the data processing.

7. The method of claim 6, wherein comparing stored data from the first radiation-tolerant FPGA to stored date from the second radiation-tolerant FPGA to detect errors in the data or the data processing is performed by a radiation-hardened processor of the processing system.

8. The method of claim 6, further comprising transmitting the stored data from the first radiation-tolerant FPGA and the stored data from the second radiation-tolerant FPGA to a ground station and comparing stored data from the first radiation-tolerant FPGA to stored data from the second radiation-tolerant FPGA at the ground station.

9. The method of claim 6, wherein storing one of the first set of output data and the second set of output data in a memory of the processing system comprises storing one of the first set of output data and the second set of output data in two separate memories of the processing system to create a first instance of the data and a second instance of the data, and wherein storing one of the third set of output data and the fourth set of output data in a memory of the processing system comprises storing one of the third set of output data and the fourth set of output data in two separate memories of the processing system to create a third instance of the data and a fourth instance of the data.

10. The method of claim 9, further comprising comparing each of the first, second, third and fourth instances of stored data with each of the other instances of stored data three times.

* * * * *